(12) United States Patent
Kohno et al.

(10) Patent No.: US 10,312,057 B2
(45) Date of Patent: Jun. 4, 2019

(54) PLASMA PROCESSING APPARATUS

(71) Applicant: TOKYO ELECTRON LIMITED, Tokyo (JP)

(72) Inventors: Masayuki Kohno, Austin, TX (US); Yusuke Yoshida, Miyagi (JP); Naoki Matsumoto, Miyagi (JP); Ippei Shimizu, Miyagi (JP); Naoki Mihara, Miyagi (JP); Jun Yoshikawa, Miyagi (JP); Michitaka Aita, Miyagi (JP); Yoshikazu Azumaya, Miyagi (JP); Junsuke Hoshiya, Miyagi (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 655 days.

(21) Appl. No.: 14/883,287

(22) Filed: Oct. 14, 2015

(65) Prior Publication Data
US 2016/0126114 A1 May 5, 2016

(30) Foreign Application Priority Data
Oct. 30, 2014 (JP) ................................. 2014-221821

(51) Int. Cl.
C23C 16/00 (2006.01)
C23F 1/00 (2006.01)
H01L 21/3063 (2006.01)
H01J 37/32 (2006.01)

(52) U.S. Cl.
CPC .... *H01J 37/32192* (2013.01); *H01J 37/3222* (2013.01); *H01J 37/32238* (2013.01); *H01J 37/32449* (2013.01); *H01J 37/32495* (2013.01)

(58) Field of Classification Search
USPC ...... 156/345.41; 118/723 MW, 723 I, 723 IR
See application file for complete search history.

(56) References Cited

U.S. PATENT DOCUMENTS

| | | | | |
|---|---|---|---|---|
| 2006/0060141 | A1* | 3/2006 | Kamaishi | H01J 37/3244 118/715 |
| 2007/0181145 | A1* | 8/2007 | Ishizuka | B08B 7/0035 134/1.1 |
| 2008/0063798 | A1* | 3/2008 | Kher | C23C 16/34 427/255.394 |
| 2010/0291319 | A1* | 11/2010 | Yamashita | H01J 37/32495 427/575 |
| 2011/0240598 | A1 | 10/2011 | Okayama et al. | |

(Continued)

FOREIGN PATENT DOCUMENTS

JP 2007-094924 * 11/2007
WO 2010058642 A1 5/2010

OTHER PUBLICATIONS

English Machine Translation JP 2007294924, Sasaki (Year: 2007).*

*Primary Examiner* — Rakesh K Dhingra
(74) *Attorney, Agent, or Firm* — Rothwell, Figg, Ernst & Manbeck, P.C.

(57) ABSTRACT

A plasma processing apparatus includes a processing chamber, a table disposed in the processing chamber, a dielectric window provided at the processing chamber, and a surrounding body made of a dielectric material surrounding a processing space between the table and the dielectric window. The dielectric window and the surrounding body are separated from each other in a vertical direction with a predetermined gap therebetween.

5 Claims, 9 Drawing Sheets (56) References Cited

U.S. PATENT DOCUMENTS

2012/0067845 A1\* 3/2012 Monden ............ H01J 37/32192
                                                      216/69
2013/0255576 A1\* 10/2013 Rasheed ................ C23C 14/34
                                                      118/723 R
2015/0371825 A1\* 12/2015 Kobayashi ........ C23C 16/45565
                                                      156/345.34

\* cited by examiner

PLASMA PROCESSING APPARATUS

CROSS-REFERENCE TO RELATED APPLICATIONS

This application claims priority to Japanese Patent Application No. 2014-221821 filed on Oct. 30, 2014, the entire contents of which are incorporated herein by reference.

FIELD OF THE INVENTION

The disclosure relates to a plasma processing apparatus including a dielectric window and a slot plate.

BACKGROUND OF THE INVENTION

A conventional plasma processing apparatus includes a processing chamber, a table disposed in the processing chamber, a dielectric window provided at the processing chamber, and a slot plate provided on the dielectric window. In this plasma processing apparatus, a substrate mounted on the table is processed by a plasma generated below the dielectric window by supplying a microwave to the slot plate. In other words, the slot plate and the dielectric window form a radial line slot antenna. When the microwave is irradiated to the antenna, the plasma is generated and various processes can be performed by using the plasma. Depending on types of gases used for plasma generation, various processes can be performed. In such an apparatus, etching or film formation is performed (see, e.g., International Publication No, WO2010/058642).

The conventional plasma processing apparatus has a problem that an inner surface of the processing chamber is etched or a contamination source generated by the etching of the inner surface of the processing chamber is deposited on the wafer W. In order to protect the inner surface of the processing chamber, the present inventors have suggested a surrounding body made of a dielectric material which surrounds a processing space between the table and the dielectric window to protect the inner surface of the processing chamber is protected.

When a bottom surface of the dielectric window has a recess and an opening end of the recess of the dielectric window has a downwardly protruding protrusion, the plasma generated in the recess of the dielectric window can be prevented from reaching the inner surface of the processing chamber by the protrusion.

However, the present inventors have found that the stability of the plasma deteriorates by the microwave propagation to the surrounding body in the plasma processing apparatus employing the surrounding body.

SUMMARY OF THE INVENTION

In view of the above, the disclosure provides a plasma processing apparatus capable of reducing deterioration of stability of a plasma while protecting an inner surface of a processing chamber in a plasma processing apparatus.

In accordance with an aspect, there is provided a plasma processing apparatus including: a processing chamber; a table disposed in the processing chamber; a dielectric window provided at the processing chamber; and a surrounding body made of a dielectric material surrounding a processing space between the table and the dielectric window, wherein the dielectric window and the surrounding body are separated from each other in a vertical direction with a predetermined gap therebetween.

In accordance with another aspect, there is provided a plasma processing apparatus including: a processing chamber; a table disposed in the processing chamber; a dielectric window provided at the processing chamber; a slot plate provided on the dielectric window, and a surrounding body made of a dielectric material surrounding the processing space between the table and the dielectric window. This plasma processing apparatus processes a substrate mounted on the table by generating a plasma below the dielectric window by inputting a microwave into the slot plate. The bottom surface of the dielectric window has a recess, and an opening end of the recess of the dielectric window has a downwardly protruding protrusion. A side surface of the outer side of the protrusion faces an inner surface of the processing chamber. The lower end of the protrusion and the surrounding body are separated from each other in a vertical direction with a predetermined gap therebetween.

BRIEF DESCRIPTION OF THE DRAWINGS

The objects and features of the disclosure will become apparent from the following description of embodiments, given in conjunction with the accompanying drawings, in which.

DETAILED DESCRIPTION OF THE EMBODIMENTS

Hereinafter, a plasma processing apparatus according to an embodiment will be described. Like reference numerals will be used for like parts, and redundant description will be omitted.

Figure 1:
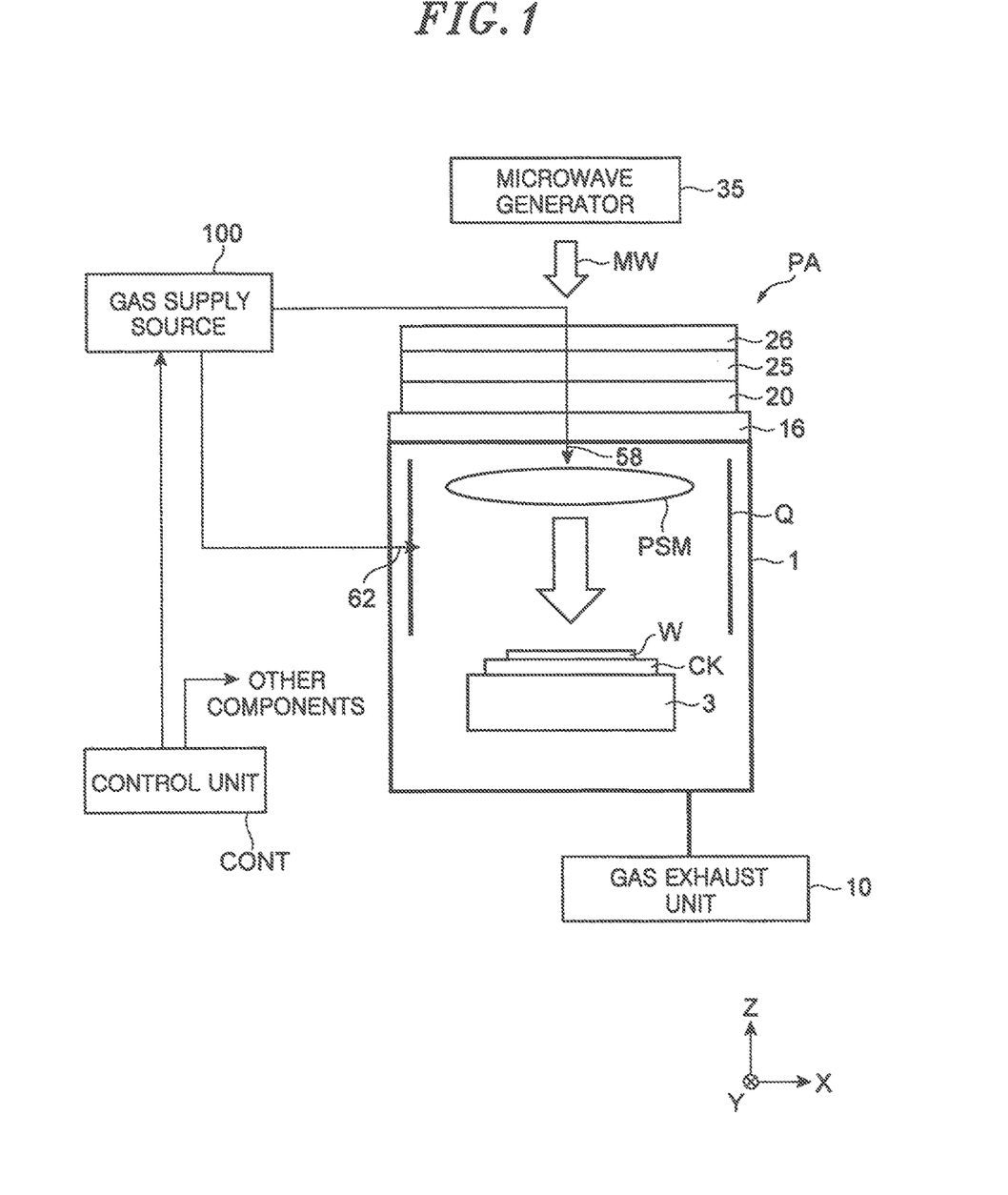
FIG. 1 is a vertical cross sectional view showing a basic configuration of a plasma processing apparatus.

FIG. 1 is a vertical cross sectional view showing a basic configuration of the plasma processing apparatus.

A plasma processing apparatus PA includes a cylindrical processing chamber 1. A ceiling portion of the processing chamber 1 is blocked by a dielectric window 16 (ceiling plate) made of a dielectric material. The processing chamber 1 is made of, e.g., aluminum, and is electrically grounded. An inner wall surface of the processing chamber 1 is coated by an insulating protective film such as alumina or the like.

A table 3 for mounting thereon a semiconductor wafer (hereinafter, referred to as "wafer") as a substrate is provided at a bottom central portion in the processing chamber 1. The wafer W is held on a top surface of the table 3. The table 3 is made of ceramic, e.g., alumina, alumina nitride or the like.

A heater (not shown) connected to a power supply is buried in the table 3, so that the wafer W can be heated to a predetermined temperature.

An electrostatic chuck CK for electrostatically attracting the wafer W mounted on the table 3 is provided on the top surface of the table 3. The electrostatic chuck CK is connected to a bias power supply for applying a bias DC current or a high frequency power (RF power) via a matching unit.

Provided at a bottom portion of the processing chamber 1 is a gas exhaust line for exhausting a processing gas through a gas exhaust port disposed at a position lower than the top surface of the wafer W mounted on the table 3. A gas exhaust unit 10 such as a vacuum pump or the like is connected to the gas exhaust line. A pressure in the processing chamber 1 is controlled to a predetermined pressure by the gas exhaust unit 10.

The dielectric window 16 is provided at the ceiling portion of the processing chamber 1 through a sealing for ensuring airtightness, such as an O-ring or the like. The dielectric window 16 is made of a dielectric material, e.g., quartz, alumina ($Al_2O_3$), aluminum nitride (AlN) or the like. The dielectric window 16 transmits a microwave.

A disc-shaped slot plate 20 is provided on a top surface of the dielectric window 16. The slot plate 20 is made of a conductive material, e.g., Cu plated or coated by Ag, Au, or the like. A plurality of slots having a T-shape or an L-shape, for example, is concentrically arranged at the slot plate 20.

A dielectric plate 25 for compressing a wavelength of a microwave is provided on the top surface of the slot plate 20. The dielectric plate 25 is made of a dielectric material, e.g., quartz ($SiO_2$), alumina ($Al_2O_3$), aluminum nitride (AlN), or the like. The dielectric plate 25 is covered by a conductive cover 26. An annular heat medium flow path is formed in the cover 26. The cover 2 and the dielectric plate 25 are controlled to a predetermined temperature by a heat medium flowing through the heat medium flow path. In case of a microwave of 2.45 MHz, for example, a wavelength in vacuum is about 12 cm and a wavelength in the dielectric window 16 made of alumina is about 3 cm to 4 cm.

A coaxial waveguide (not shown) for propagating a microwave is connected to a center of the cover 26. The coaxial waveguide includes an inner conductor and an outer conductor. The inner conductor is connected to a center of the slot plate 20 while penetrating through a center of the dielectric plate 25. The coaxial waveguide is connected to a microwave generator 35 via a mode converter and a rectangular waveguide. Microwaves of 660 MHZ, 915 MHz or 8.35 GHz may be used instead of the microwave of 2.45 GHz.

A microwave MW generated by the microwave generator 35 propagates to the dielectric plate 25 through the rectangular waveguide, the mode transducer, and the coaxial waveguide, which serve as a microwave introduction path. The microwave MW propagated to the dielectric plate 25 is supplied into the processing chamber 1 through the slots of the slot plate 20 and the dielectric window 16. An electric field is generated below the dielectric window 16 by the microwave and a processing gas in the processing chamber 1 is turned into a plasma. In other words, when the microwave MW is supplied from the microwave generator 35 to the antenna, a plasma is generated.

A lower end of the inner conductor connected to the slot plate 20 has a truncated circular cone shape. The microwave can efficiently propagate from the coaxial waveguide to the dielectric plate 25 and the slot plate 20 without a loss.

The microwave plasma generated by the radial line slot antenna has a feature that a plasma having a relatively high electron temperature which is generated in a region PSM immediately below the dielectric window 16 (hereinafter, referred to as "plasma excitation region") is diffused downward as indicated by a large arrow and becomes a plasma raw having a relatively low electron temperature of about 1 eV to 2 eV in a region directly above the wafer W (hereinafter, referred to as "plasma diffusion region"). In other words, unlike the plasma generated by parallel plates or the like, the microwave plasma generated by the radial line slot antenna has a feature that the electron temperature distribution of the plasma is clearly represented by a function of a distance from the dielectric window 16. More specifically, the electron temperature of several eV to about 10 eV in a region directly below the dielectric window 16 decreases to about 1 eV to 2 eV in a region directly above the wafer W. Since the wafer W is processed in the region (plasma diffusion region) where the electron temperature of the plasma is low, a recess or the like which may damage the wafer W is reduced. If the processing gas is supplied to the region (plasma exciting region) where the electron temperature of the plasma is high, the processing gas is easily excited and dissociated. If the processing gas is supplied to the region where the electron temperature of the plasma is low (the plasma diffusion region), the degree of dissociation is decreased compared to the case where the processing gas is supplied to the vicinity of the plasma exciting region.

A central introduction unit for introducing the processing gas to the central portion of the wafer W is provided at the center of the dielectric window 16 at the ceiling portion of the processing chamber 1. The central introduction unit is connected to a processing gas supply line. The processing gas supply line is formed in the inner conductor of the coaxial waveguide.

The central introduction unit includes a cylindrical block (not shown) inserted into a cylindrical space provided at the center of the dielectric window 16 and a tapered space continuous to a cylindrical space having a gas injection opening at a leading end thereof. The block is made of a conductive material, e.g., aluminum or the like, and is electrically grounded. The block made of aluminum may be coated by anodically oxidized alumina ($Al_2O_3$), yttria ($Y_2O_3$) or the like. A plurality of central inlet openings penetrates through the block in a vertical direction. A gap (gas storage) exists between the top surface of the block and the bottom surface of the inner conductor of the coaxial waveguide. The central inlet openings have a circular or elongated hole shape in a plan view in consideration of a required conductance or the like. The shape of the tapered space is not limited and may be simply a cylindrical shape.

The processing gas supplied into the gas storage above the block is diffused in the gas storage and then injected downward toward the central portion of the wafer W through the central inlet openings of the block.

In the processing chamber 1, a ring-shaped peripheral introduction unit for supplying a processing gas to a peripheral portion of the wafer W is provided to surround the periphery of the space above the wafer W. The peripheral introduction unit is positioned below a central inlet openings 58 formed at the ceiling portion and above the wafer W mounted on the table 3. The peripheral introduction unit is an annular hollow pipe. A plurality of peripheral inlet openings 62 spaced apart from each other at a regular interval in a circumferential direction is formed at an inner peripheral side of the peripheral inlet unit. The processing gas is injected through the peripheral inlet openings 62 toward the center of the peripheral introduction unit. The peripheral induction unit is made of e.g., quartz. A supply line made of stainless steel penetrates through the sidewall of the processing chamber 1. The supply line is connected to the peripheral inlet openings 62 of the peripheral introduction unit. The processing gas supplied into the peripheral introduction unit through the supply line is injected toward the inner side of the peripheral introduction unit through the peripheral inlet openings 62. The processing gas injected through the peripheral inlet openings 62 is supplied to a space above the peripheral portion of the wafer W. Instead of providing the ring-shaped peripheral introduction unit, a plurality of peripheral inlet openings 62 may be formed at the inner surface of the processing chamber 1.

The processing gas is supplied from the gas supply source 100 to the central inlet opening 58 and the peripheral inlet openings 62. A gas supply source 100 includes a common gas source and an additional gas source and supplies processing gases for various processes such as plasma etching, plasma CVD processing and the like. A desired processing gas can be obtained by mixing gases from a plurality of gas sources while controlling flow rates thereof using flow rate control valves provided in the respective supply lines. The flow rate control valves can be controlled by a control unit CONT. The control unit CONT also controls starting of the microwave generator 35, heating of the wafer W, evacuation using the gas exhaust unit 10 and the like.

The processing gases from the common gas source and the additional gas source are mixed at a ratio suitable for the purpose and supplied to the central inlet opening 58 and the peripheral inlet openings 62.

For example, a rare gas (Ar gas or the like) may be used as a gas from the common gas source. However, other additional gases may also be used. In the case of etching a silicon-based film such as polysilicon or the like, Ar gas, HBr gas (or $Cl_2$ gas), and $O_2$ gas are supplied as the additional gas. In the case of etching an oxide film such as $SiO_2$ or the like, Ar gas, CHF-based gas, CF-based gas, and $O_2$ gas are supplied as the additional gas. In the case of etching a nitride film such as SiN or the like, Ar gas, CF-based gas, CHF-based gas, and $O_2$ gas are supplied as the additional gas.

The CHF-based gas may include $CH_3 (CH_2)_3CH_2F$, $CH_3 (CH_2)_4CH_2F$, $CH_3 (CH_2)_7CH_2F$, $CHCH_3F_2$, $CHF_3$, $CH_3F$, $CH_2F_2$ or the like.

Although the CF-based gas may be $C(CF_3)_4$, $C(C_2F_5)_4$, $C_4F_8$, $C_2F_2$, $C_5F_8$ or the like, it is preferable to use $C_5F_8$ in order to obtain dissociated species suitable for the etching.

A central inlet gas Gc is supplied to the central inlet opening 58. A peripheral inlet gas Gp is supplied to the peripheral inlet openings 62. In this apparatus, it is possible to change gas types or partial pressures of the central inlet gas Gc supplied to the central portion of the wafer W and the peripheral inlet gas Gp supplied to the peripheral portion of the wafer W, so that the characteristics of the plasma treatment can be variously modified. In this apparatus, the same gas may be supplied from the common gas source and the additional gas source, or different gases may be supplied from the common gas source and the additional gas source.

In order to suppress dissociation of the etching gas, a plasma excitation gas may be supplied from the common gas source and an etching gas may be supplied from the additional gas source. For example, in the case of etching a silicon-based film, only Ar gas is supplied as the plasma excitation gas from the common gas source and HBr gas and $O_2$ gases are supplied as etching gases from the additional gas sources. The common gas source may supply a common gas such as $O_2$, $SF_6$ or the like other than a cleaning gas.

The above-described gas contains a so-called negative gas. The negative gas denotes a gas having an electron attachment cross section area at an electron energy of about 10 eV or less, e.g., HBr, SF or the like.

Here, in order to achieve uniform plasma generation and uniform processing over the surface of the wafer W, a technique that controls a distribution ratio of the common gas by using the flow splitter and controls the amount of gases introduced from the central inlet opening 58 and the peripheral inlet openings 62 is referred to as "RDC (Radical Distribution Control)". The RDC value is expressed as a ratio of the amount of gas introduced from the central inlet opening 58 with respect to the amount of gas introduced from the peripheral inlet openings 62. In general RDC, the same gas is supplied from the central inlet opening 58 and the peripheral inlet openings 62 into the chamber. An optimum RDC value is determined experimentally depending on types of films to be etched or various conditions.

In the etching process, by-products (etching residue or deposits) are generated by the etching. In order to improve gas flow in the processing chamber 1 and easily discharge the by-products to the outside of the processing chamber, it is considered to alternately introduce gases from the central inlet opening 58 and the peripheral inlet opening 62. This can be realized by switching a RDC value temporally. For example, the by-products are removed from the processing chamber 12 by repeating a step of introducing a large amount of gas to the central portion of the wafer W and a step of introducing a large amount of gas to the peripheral portion of the wafer W at a predetermined cycle and controlling gas flow. Accordingly, a uniform etching rate can be obtained.

The plasma processing apparatus shown in FIG. 1 is a general apparatus using a slot plate and a dielectric window and may be variously modified. The slot plate 20 forms the antenna together with the dielectric window 16. A through hole is formed at the center of the dielectric window 16 in a diametrical direction thereof to extend through the dielectric window 16 in the thickness direction thereof, i.e., in the up-down direction in the drawing sheet. The gas is supplied into the processing chamber through the through hole serving as the central inlet opening 58.

The plasma processing apparatus includes a cylindrical surrounding body Q (quartz liner in this example) provided in the processing chamber 1.

As described above, the plasma processing apparatus of the present embodiment includes the processing chamber 1, the table 3 disposed in the processing chamber 1, the dielectric window 16 provided at the processing chamber 1, the slot plate 20 provided on the dielectric window 16, and the surrounding body Q made of a dielectric material surrounding the processing space between the table 3 and the dielectric window 16. This plasma processing apparatus processes the substrate W mounted on the table 3 by generating a plasma below the dielectric window 16 by inputting the microwave into the slot plate 20.

Figure 2:
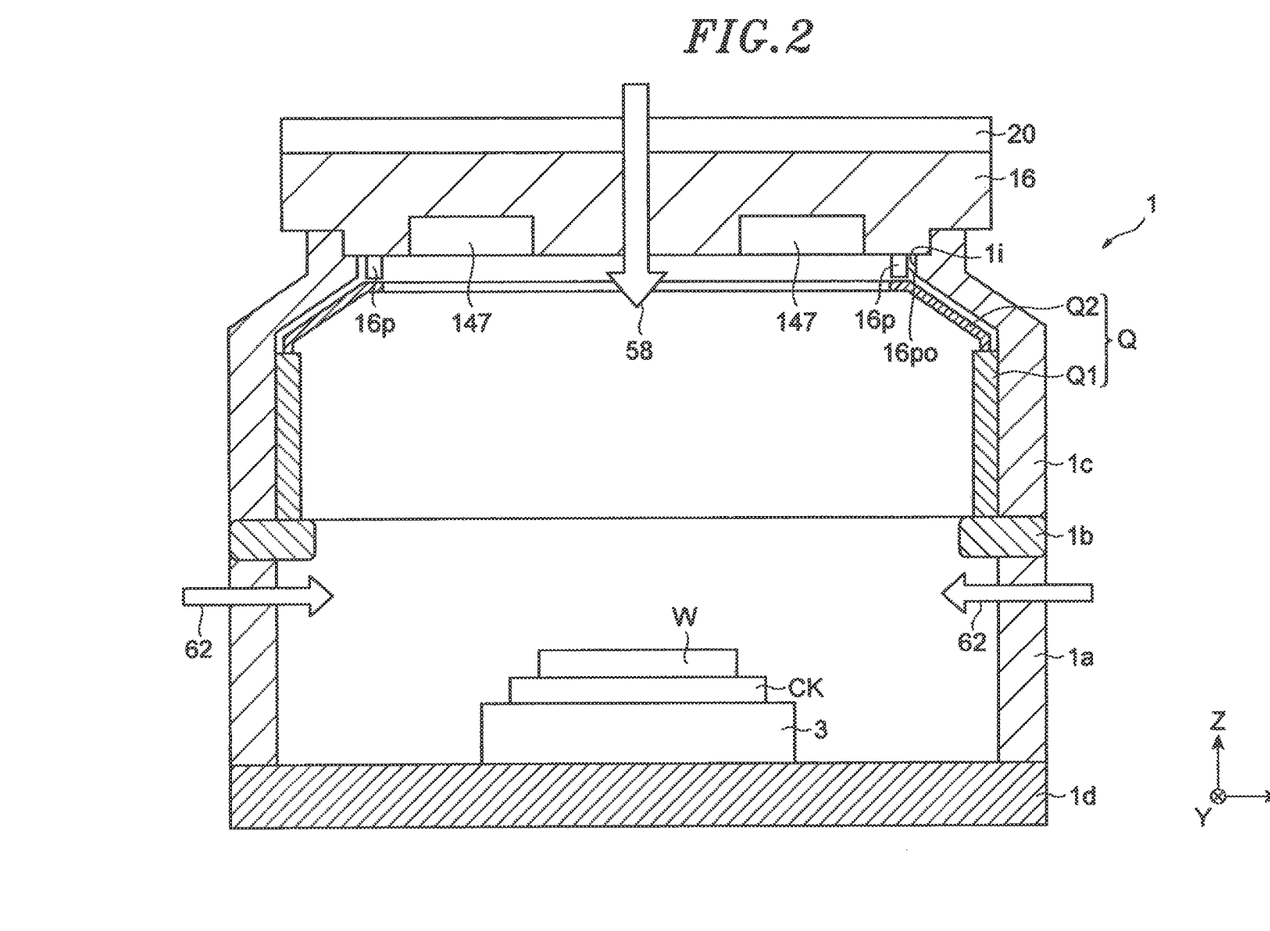
FIG. 2 is a vertical cross sectional view showing principal parts of the plasma processing apparatus.

FIG. 2 is a vertical cross sectional view showing principal parts of the plasma processing apparatus. In an XYZ three-dimensional orthogonal coordinate system, a positive (+) direction of a Z-axis is an upward direction and a negative (−) direction of the Z-axis is a downward direction. A main plane of the table 3 on which the substrate is mounted is an XY plane.

In the above plasma processing apparatus, the bottom surface of the dielectric window 16 has a recess 147, and an opening end of the recess 147 of the dielectric window 16 has a downwardly protruding protrusion 16p. A side surface 16*po* of the outer side (directed from the center toward the periphery in the diametrical direction of the dielectric member) of the protrusion 16*p* faces an inner surface 1*i* of the processing chamber 1. The lower end of the protrusion 16*p* and the surrounding body Q are separated from each other in a vertical direction with a predetermined first gap G1 (see FIG. 5) therebetween.

The recess 147 of the dielectric window 16 has an annular shape. However, the shape and the number of the recess are not limited to those described above. When a plurality of recesses is formed at the dielectric window 16, the plasma tends to be confined in the recesses. In addition, a small circular recess may be formed near the central portion of the dielectric window 16 or at a bottom surface of the annular recess.

A gas introduction opening is formed at the center of the dielectric window 16 and serves as the central inlet opening 58. Gas introduction openings are also formed at an outer wall of the processing chamber 1 and serve as the peripheral inlet opening 62. The processing chamber 1 is formed by stacking a lower cylindrical body 1*a*, a cylindrical supporting member 1*b*, and an upper cylindrical body 1*c* on a bottom plate 1*d* and fixing the dielectric window 16 on the upper cylindrical body 1*c*.

In this plasma processing apparatus, the protrusion 16*p* of the dielectric window 16 is formed at a position that prevents the inner surface 1*i* of the processing chamber 1 from being exposed to the plasma generated in the recess 147 of the dielectric window 16 and, thus, the inner surface of the processing chamber 1 is protected. Further, the inner surface of the processing chamber 1 is protected from the plasma by the surrounding body Q.

The predetermined first gap G1 (see FIG. 5) exists between the surrounding body Q and the protrusion 16*p*. The microwave can be absorbed in the G1. Due to the presence of the gap G1, it is possible to suppress the occurrence of excessive discharge and the deterioration of the stability of the plasma.

The surrounding body Q includes a lower surrounding body Q1, and an upper surrounding body Q2 stacked on the lower cylindrical body.

Figure 3:
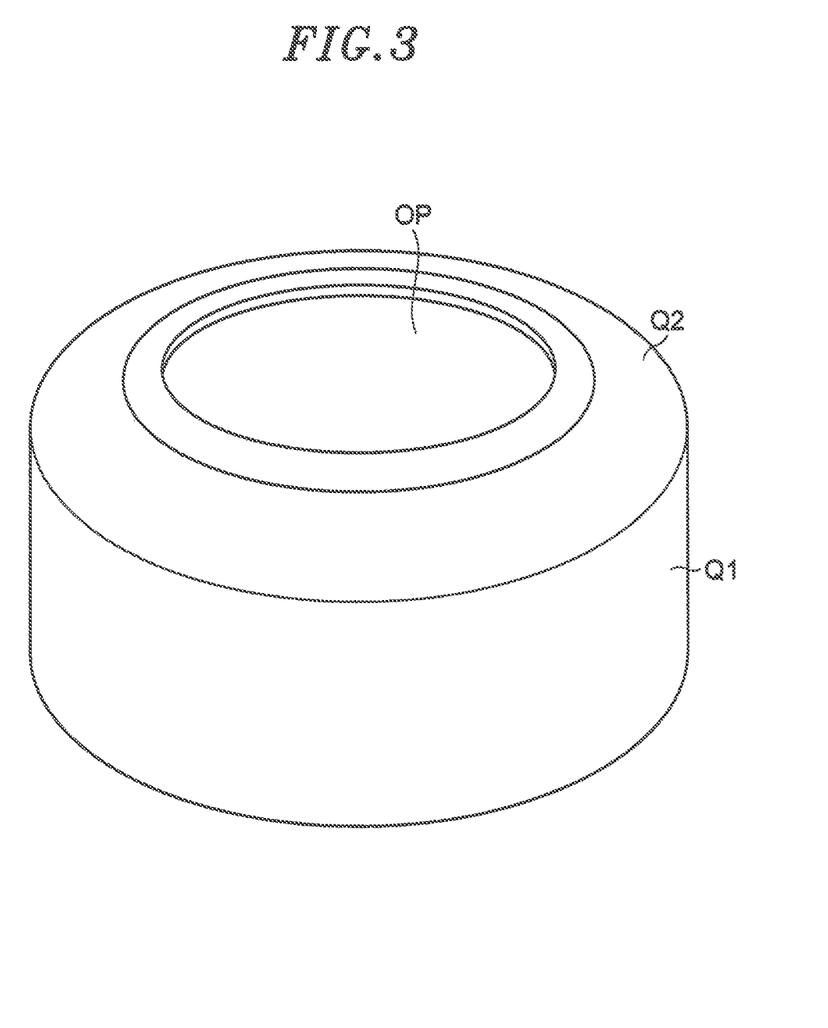
FIG. 3 is a perspective view of a surrounding body.

FIG. 3 is a perspective view of the surrounding body.

The lower surrounding body Q1 has a cylindrical shape. The upper surrounding body Q2 has a tubular shape with an open top and an open bottom and a truncated cone-shaped outer surface. A circular opening OP is formed at a top portion of the upper surrounding body Q2. The opening OP faces the bottom surface of the dielectric window. The lower surrounding body Q1 and the upper surrounding body Q2 are connected by a pin PIN2 (see FIG. 4).

Figure 4:
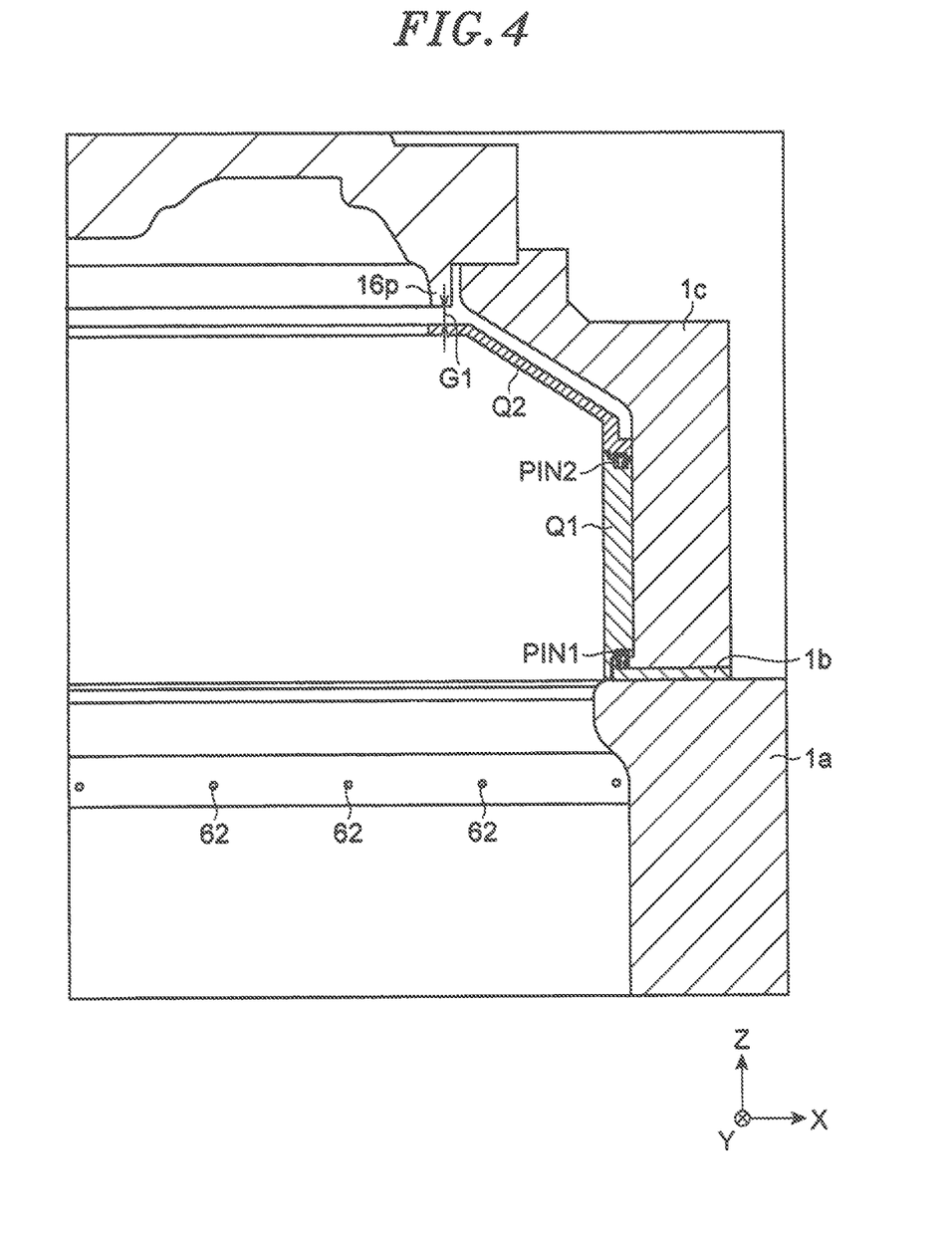
FIG. 4 is a vertical cross sectional view of the plasma processing apparatus which shows a configuration around a protrusion and the surrounding body.

FIG. 4 is a vertical cross sectional view of the plasma processing apparatus which shows a configuration around the protrusion and the surrounding body.

A gap extending in an inclined direction is formed between the upper surrounding body Q2 and the upper cylindrical body 1*c* forming the processing chamber. This gap continues to the gap (minimum value) G1 formed between the lower end of the protrusion 16*p* and the upper surrounding body Q2. The peripheral inlet openings 62 formed at the processing chamber 1*a* are positioned below the surrounding body Q1.

The present inventors have found from the study on the absorption of the microwave that when the microwave cannot be absorbed in the first gap G1, excessive discharge occurs between the inner surface of the processing chamber and the surrounding body, e.g., in the gap extending in the inclined direction, by the microwave and this leads to deterioration of the stability of the plasma.

The predetermined first gap G1 preferably has a distance that enables glow discharge to occur. In that case, the excessive microwave propagation can be suppressed and, thus, the occurrence of the excessive discharge can be suppressed. Accordingly, the deterioration of the stability of the plasma can be suppressed.

Figure 9:
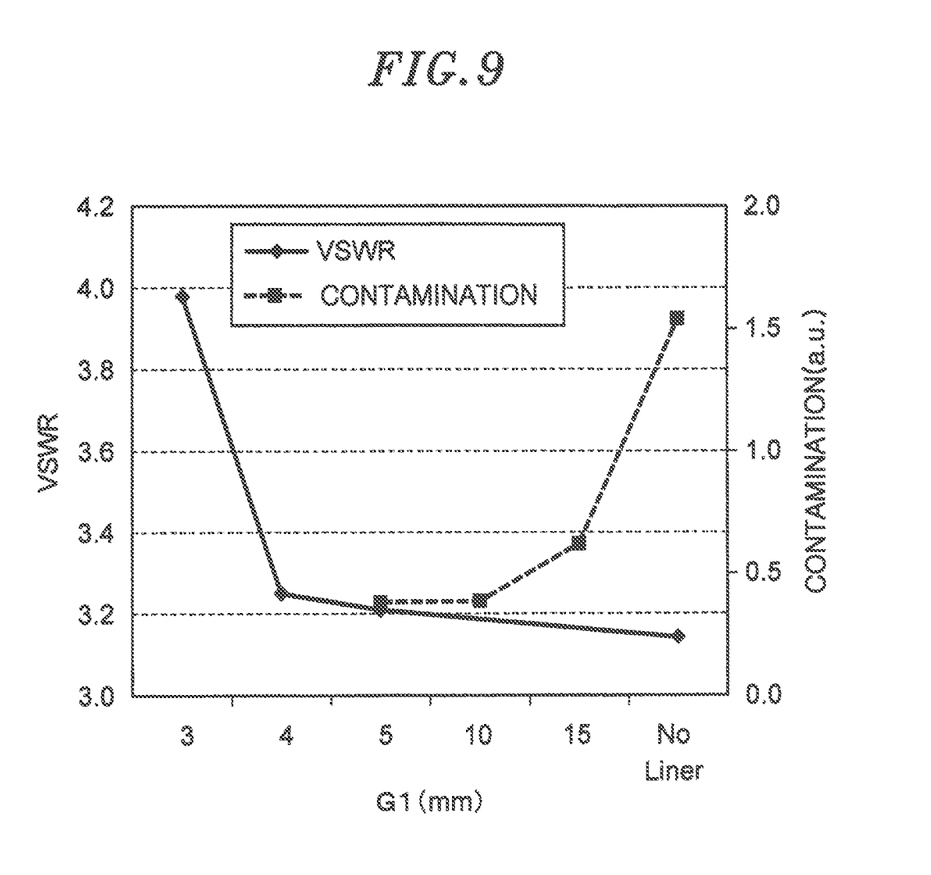
FIG. 9 is a graph showing relation between a gap G1 (mm), a voltage standing wave ratio (VSWR), and the amount of contamination (source).

FIG. 9 is a graph showing relationship between the gap G1 (mm), the voltage standing wave ratio (VSWR), and the amount of contamination (source). As the gap G1 becomes smaller, the value of VSWR is abruptly increased. When the microwave propagates to the surrounding body Q2, a strong electric field is generated in the gap between the wall of the processing chamber and the surrounding body. Therefore, the excessive discharge may occur easily.

Referring to the graph, the first gap G1 is preferably greater than or equal to 4 mm and smaller than or equal to 15 mm. When such a range is satisfied, the glow discharge can occur, so that the microwave can be absorbed in the first gap G1. If the first gap G1 is smaller than the minimum value, the microwave propagates without being absorbed. Thus, the excessive discharge occurs and the plasma is changed, which is not preferable. If the first gap is greater than the maximum value, there occurs a phenomenon that a contamination source such as dust or the like is generated near the gap. Accordingly, it is preferable that the first gap is within the above-described range.

Figure 5:
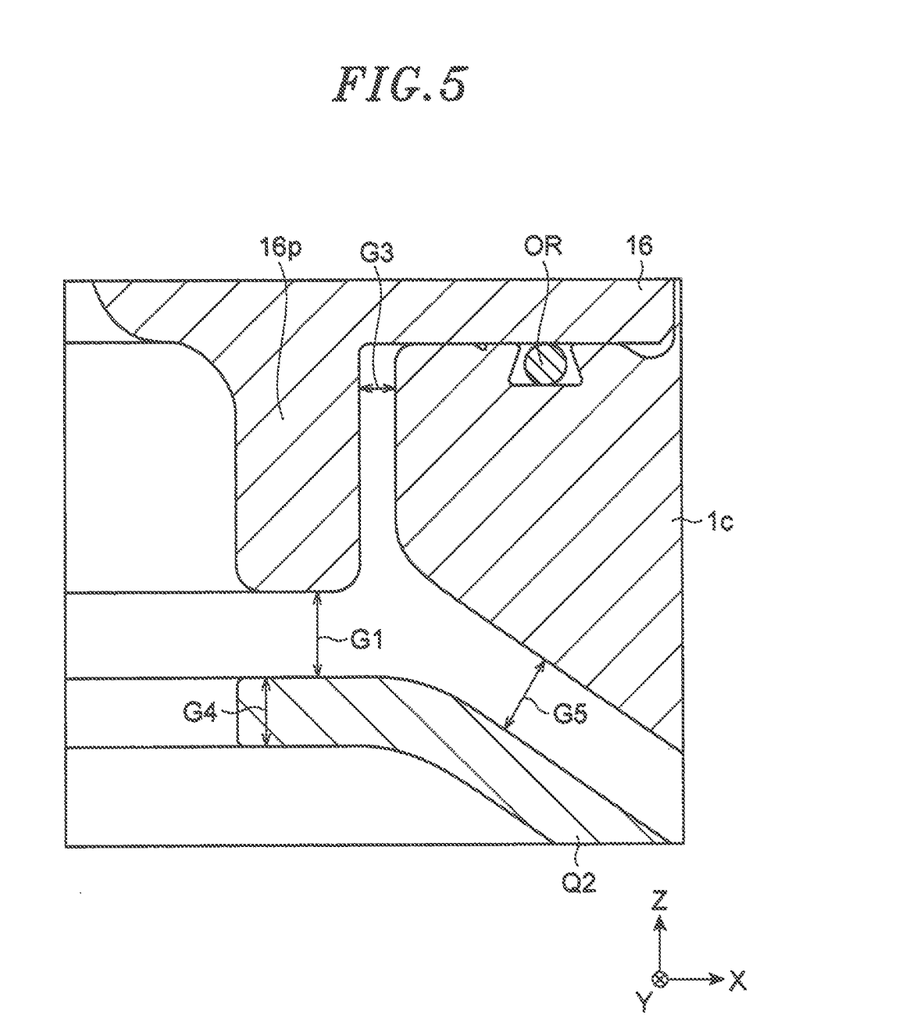
FIG. 5 is an enlarged vertical cross sectional view showing a configuration around the protrusion.

FIG. 5 is an enlarged vertical cross sectional view showing a configuration around the protrusion. An O-ring OR is provided between an outer periphery of the bottom surface of the dielectric window 16 and the upper cylindrical body 1*c*.

The upper surrounding body Q2 has a flat upper portion having a thickness G4. A gap extending downward in the inclined direction from the first gap G1 is set to G5. A gap extending upward from the first gap G1 is set to G3.

As described above, the gap G1 is greater than or equal to 4 mm and smaller than or equal to 15 mm. The gap G5 and the gap G3 are properly set to be smaller than or equal to the gap G1.

Figure 6:
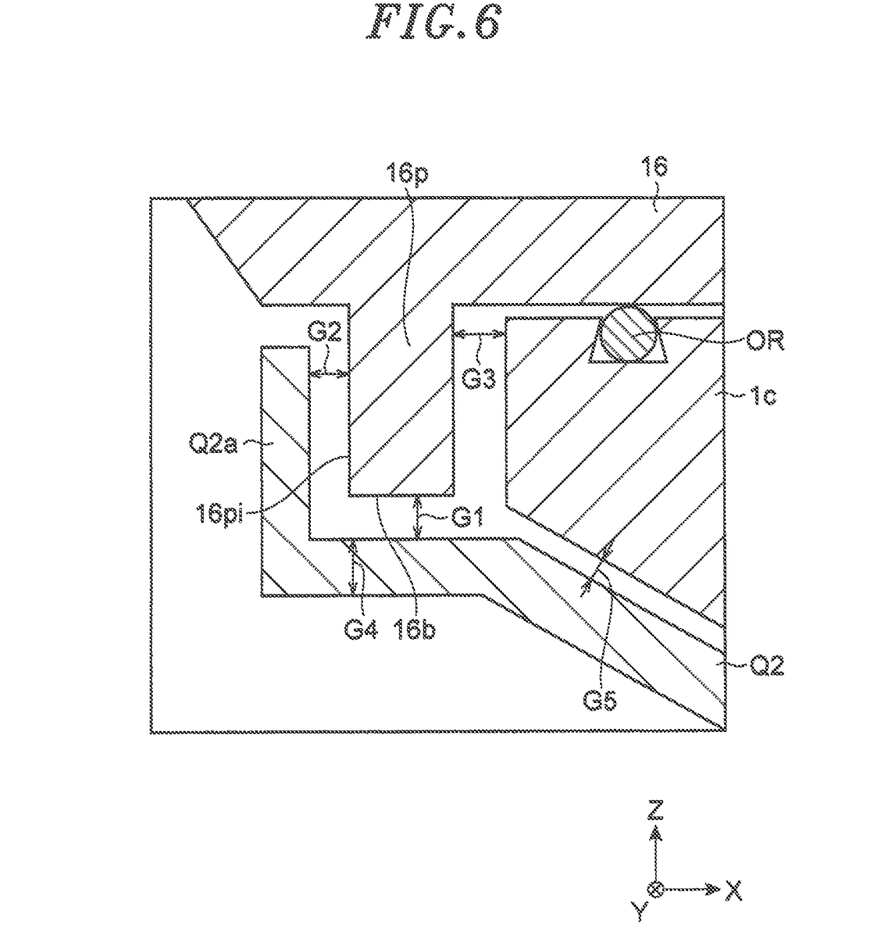
FIG. 6 is an enlarged vertical cross sectional view showing another configuration around the protrusion.

FIG. 6 is an enlarged cross sectional view showing a configuration around the protrusion.

The protrusion 16*p* has an inner side surface 16*pi* facing the center of the dielectric window 16 (directed toward the negative direction of the X-axis in FIG. 6). An upper end portion Q2*a* of the upper surrounding body Q2 faces the inner side surface 16*pi* of the protrusion 16*p*. The upper end portion Q2*a* extends vertically upward. The upper end portion Q2*a* and the inner side surface 16*pi* are separated from each other in the horizontal direction (X axis direction) with a second gap G2 therebetween.

In that case, the upper end portion Q2*a* of the surrounding body serves as a wall against the protrusion 16*p* when viewed from the center of the dielectric window 16. Further, a lower leading end 16*b* of the protrusion 16*p* also faces the upper surrounding body Q2, So that a complicated labyrinth structure is provided around the protrusion 16*p*.

In other words, the upper end portion Q2*a* of the upper surrounding body Q2 is closer to the center of the upper surrounding body Q2 than a main body (outermost cylindrical portion) of the upper surrounding body Q2, and extends in the vertical direction (Z-axis direction). The horizontal portion (defined by the thickness G4) between the upper end portion Q2*a* and the main body extends toward the center of the upper surrounding body Q2. The lower end (protrusion 16*p*) of the outer periphery of the dielectric window which defines the first gap G1 is located at the outer side of the upper end portion Q2a and above the horizontal portion. In this case, the horizontal portion and the upper end portion Q2a form a receiving tray structure for the lower end of the outer periphery of the dielectric window, i.e., the protrusion 16p of the outer periphery of the dielectric window. Therefore, the contamination source can be received in the receiving tray structure.

In this manner, it is difficult for the contamination source such as dust or the like to enter the periphery of the protrusion 16. Even if the contamination source is generated by the occurrence of the discharge in the gap G3, the contamination source falls downward through the gap G2 without entering the processing space between the substrate and the dielectric window.

The gap G2 is preferably within the range from 4 mm to 15 mm. In that case, it is possible to suppress the microwave propagation and the downward falling of the contamination source.

Figure 7:
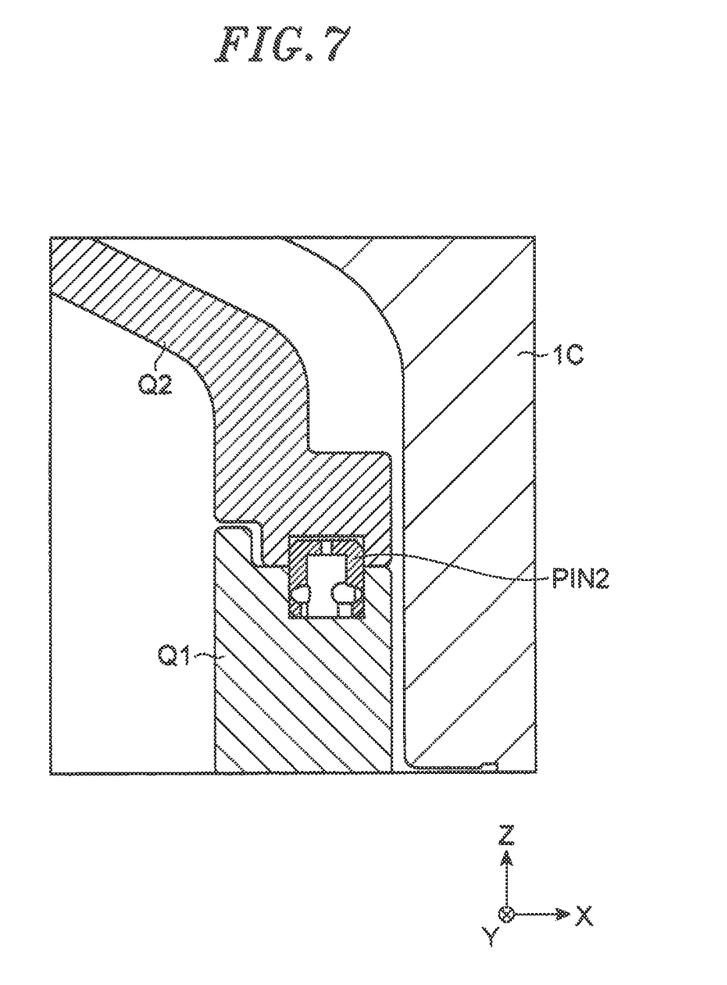
FIG. 7 is an enlarged vertical cross sectional view showing a configuration around a joint of the surrounding body.

FIG. 7 is an enlarged cross sectional view showing a configuration around a joint of the surrounding body.

The lower surrounding body Q1 and the upper surrounding body Q2 are connected to each other by a pin PIN2. A recess is formed at the upper end of the lower surrounding body Q1. The pin PIN2 is positioned in this recess. The pin PIN2 is also positioned in a recess formed at the lower end of the upper surrounding body Q2. In other words, due to the pin PIN2, the lower surrounding body Q1 and the upper surrounding body Q2 are position-aligned and the horizontal movement of the upper surrounding body Q2 is restricted. The pin PIN2 is made of an insulator such as alumina or the like, so that the occurrence of discharge near the pin PIN2 is suppressed.

Figure 8:
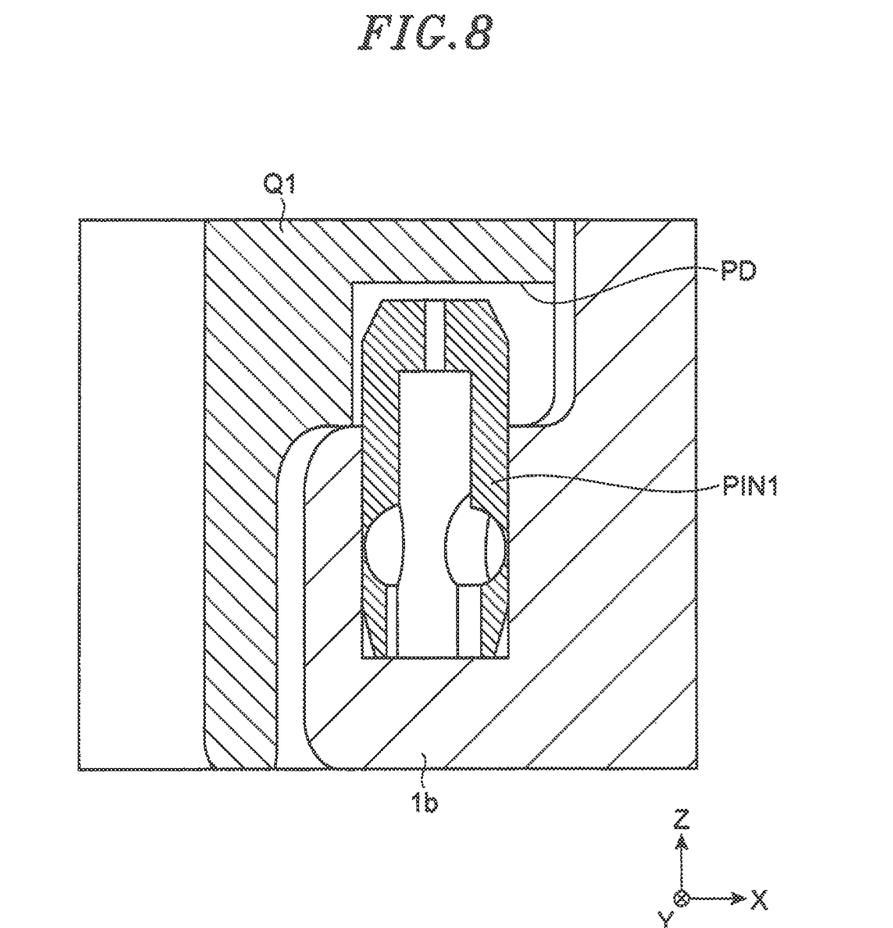
FIG. 8 is an enlarged vertical cross sectional view showing a configuration around a lower end of the surrounding body.

FIG. 8 is an enlarged cross sectional view showing a configuration around a lower end of the surrounding body.

The plasma processing apparatus further includes a supporting member 1b for supporting the lower surrounding body Q1, and an insulating pin PIN1 standing upright from the supporting member 1b. The pin PIN1 is made of alumina or the like, so that the occurrence of discharge near the pin PIN1 is suppressed. The pin PIN1 is positioned inside a position restricting recess PD formed at the bottom surface of the lower surrounding body Q1. The supporting member 1b forms a part of the processing chamber.

In this structure, the supporting member 1b forms a part of the processing chamber and is located at a fixed position. The pin PIN1 is positioned inside the recess formed at the supporting member 1b. The pin PIN1 standing upright from the recess is positioned inside the position restricting recess PD of the lower surrounding body Q1. Due to the contact between the pin PIN1 and the inner surface of the position restricting recess PD, the horizontal movement of the supporting member 1b is restricted. The pin PIN1 is an insulator, so that the occurrence of the discharge near the pin PIN1 is suppressed. Accordingly, it is possible to reduce the contamination source and suppress the deterioration of the stability of the plasma which is caused by the discharge.

The supporting member 1b is made of aluminum. An inner surface of the supporting member 1b is isolated from the processing space by the lower surrounding body Q1.

The above-described plasma processing apparatus may be various plasma processing apparatuses using a microwave supplied to the dielectric window.

While the disclosure has been shown and described with respect to the embodiments, it will be understood by those skilled in the art that various changes and modifications may be made without departing from the scope of the disclosure as defined in the following claims.

What is claimed is:

1. A plasma processing apparatus comprising:
a processing chamber:
a table disposed in the processing chamber;
a dielectric window provided at the processing chamber;
a slot plate provided on the dielectric window; and
a surrounding body made of a dielectric material surrounding a processing space between the table and the dielectric window,
wherein the dielectric window and the surrounding body are separated from each other in a vertical direction with a predetermined gap therebetween, and
wherein an upper end portion of the surrounding body is closer to a center of the surrounding body than a main body of the surrounding body, the upper end portion extends in a vertical direction, a horizontal portion between the upper end portion and the main body extends toward the center of the surrounding body, a lower end of an outer periphery of the dielectric window which defines the predetermined gap is located at an outer side of the upper end portion and above the horizontal portion.

2. The plasma processing apparatus of claim 1, further comprising:
a supporting member configured to support the surrounding body; and
an insulating pin standing upright from the supporting member,
wherein the pin is positioned inside a position restricting recess formed at a bottom surface of the surrounding body, and
the supporting member forms a part of the processing chamber.

3. A plasma processing apparatus comprising:
a processing chamber;
a table disposed in the processing chamber;
a dielectric window provided at the processing chamber;
a slot plate provided on the dielectric window; and
a surrounding body made of a dielectric material surrounding the processing space between the table and the dielectric window,
wherein a bottom surface of the dielectric window has a recess, an opening end of the recess of the dielectric window having a downwardly protruding protrusion, a side surface of the outer side of the protrusion faces an inner surface of the processing chamber, and a bottom surface of the protrusion and a top surface of the surrounding body are separated from each other in a vertical direction with a predetermined gap therebetween, and
wherein the predetermined gap between the bottom surface of the protrusion and the top surface of the surrounding body is greater than or equal to 4 mm and smaller than or equal to 15 mm.

4. The plasma processing apparatus of claim 3, wherein an upper end portion of the surrounding body is closer to a center of the surrounding body than a main body of the surrounding body,
the upper end portion extends in a vertical direction,
a horizontal portion between the upper end portion and the main body extends toward the center of the surrounding body, a lower end of the protrusion of the dielectric window which defines the predetermined gap is located at an outer side of the upper end portion and above the horizontal portion.

5. The plasma processing apparatus of claim 3, further comprising:
   a supporting member configured to support the surrounding body; and
   an insulating pin standing upright from the supporting member,
   wherein the pin is positioned inside a position restricting recess formed at a bottom surface of the surrounding body, and
   the supporting member forms a part of the processing chamber.

* * * * *